(12) United States Patent
Saitou

(10) Patent No.: US 10,770,275 B2
(45) Date of Patent: Sep. 8, 2020

(54) FILM FORMING UNIT FOR SPUTTERING APPARATUS

(71) Applicant: ULVAC, INC., Kanagawa (JP)

(72) Inventor: Shuuji Saitou, Kanagawa (JP)

(73) Assignee: ULVAC, INC., Kanagawa (JP)

( * ) Notice: Subject to any disclaimer, the term of this patent is extended or adjusted under 35 U.S.C. 154(b) by 111 days.

(21) Appl. No.: 16/311,844

(22) PCT Filed: Jun. 21, 2017

(86) PCT No.: PCT/JP2017/022797
§ 371 (c)(1),
(2) Date: Dec. 20, 2018

(87) PCT Pub. No.: WO2018/003615
PCT Pub. Date: Jan. 4, 2018

(65) Prior Publication Data
US 2019/0206662 A1    Jul. 4, 2019

(30) Foreign Application Priority Data

Jun. 29, 2016    (JP) .................................. 2016-129416

(51) Int. Cl.
*H01J 37/34*    (2006.01)
*C23C 14/35*    (2006.01)
*C23C 14/34*    (2006.01)

(52) U.S. Cl.
CPC .......... *H01J 37/3435* (2013.01); *C23C 14/34* (2013.01); *C23C 14/35* (2013.01);
(Continued)

(58) Field of Classification Search
CPC .. H01J 37/3435; H01J 37/3417; H01J 37/345; H01J 37/3497; C23C 14/34; C23C 14/35
See application file for complete search history.

(56) References Cited

FOREIGN PATENT DOCUMENTS

| JP | 52-95581 A | 8/1977 |
|---|---|---|
| JP | 1-111870 A | 4/1989 |

(Continued)

OTHER PUBLICATIONS

International Search Report and Written Opinion for PCT Patent App. No. PCT/P2017/022797 (dated Aug. 8, 2017) with English translation of the ISR.

*Primary Examiner* — John J Brayton
(74) *Attorney, Agent, or Firm* — Cermak Nakajima & McGowan LLP; Tomoko Nakajima

(57) ABSTRACT

In a film forming unit (FU) for a sputtering apparatus according to this invention, a supporting plate is provided with: a target having bonded thereto a backing plate; a magnet unit; and driving device for reciprocating the target along the supporting plate relative to the magnet unit. The backing plate is provided, in a protruded manner, with a supply pipe and a discharge pipe in communication with a coolant passage for the backing plate. A slit hole, which is elongated in the reciprocating direction of the target and through which the supply pipe and the discharge pipe penetrate, is formed in the supporting plate. The supporting plate has on its lower surface a cap body which hermetically encloses those portions of the supply pipe and the discharge pipe, inclusive of the slit hole, which are protruded downward from the slit hole.

4 Claims, 8 Drawing Sheets

(52) U.S. Cl.
CPC ........ *H01J 37/345* (2013.01); *H01J 37/3417* (2013.01); *H01J 37/3497* (2013.01)

(56) References Cited

FOREIGN PATENT DOCUMENTS

| | | |
|---|---|---|
| JP | 2000-268995 A | 9/2000 |
| JP | 2013-209690 A | 10/2013 |
| WO | WO2014/080815 A1 | 5/2014 |

FIG.1
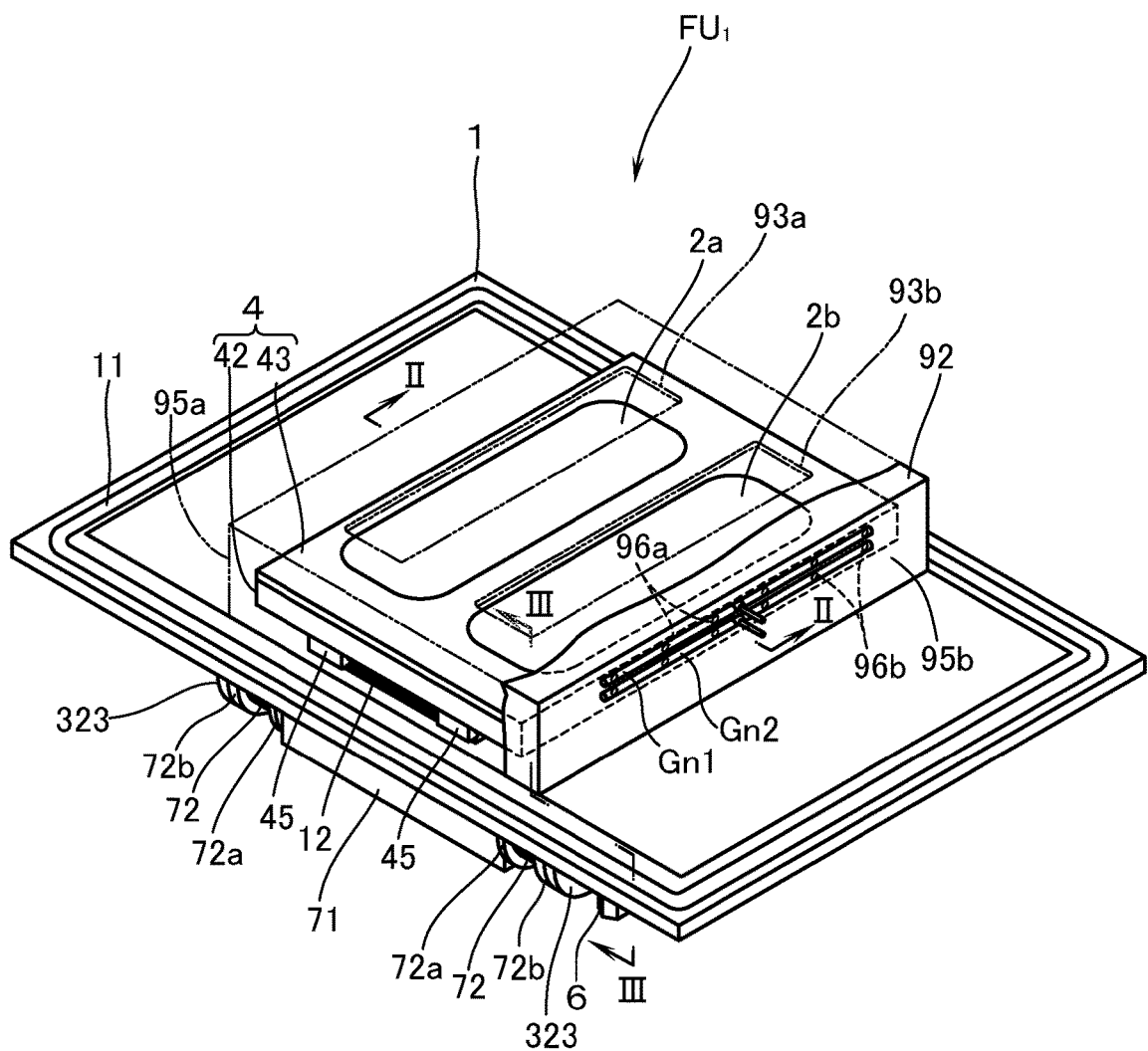
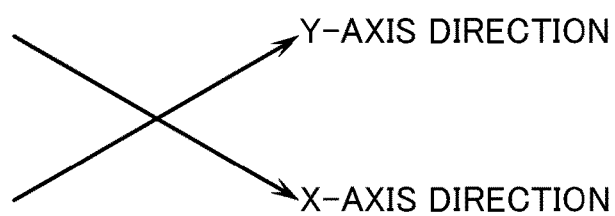

FILM FORMING UNIT FOR SPUTTERING APPARATUS

This application is a national phase entry under 35 U.S.C. § 371 of PCT Patent Application No. PCT/JP2017/022797, filed on Jun. 21, 2017, which claims priority under 35 U.S.C § 119 to Japanese Patent Application No. 2016-129416, filed Jun. 29, 2016, both of which are incorporated by reference.

TECHNICAL FIELD

The present invention relates to a film forming unit for a sputtering apparatus and, more particularly, relates to a film forming unit for a magnetron sputtering apparatus in which a target is arranged to reciprocate relative to a magnet unit.

BACKGROUND ART

This kind of film forming unit for a sputtering apparatus is known, e.g., in Patent Document 1. The unit in question is provided with a box-shaped enclosure (displacement part) which is mounted on an inner wall surface of a vacuum chamber in which film forming is performed, and a displacement plate is disposed on that side surface of the enclosure which looks inward of the vacuum chamber. The displacement plate has fixed thereto, through a supporting body, a backing plate which has a target bonded to one surface as a cathode. Further, positioned on the inside of an opening which is provided in the displacement plate, a magnet unit for causing to function a leakage magnetic field on the surface of the target is fixed to the inside of the supporting body.

The inside of the enclosure is divided by a partition wall into two chambers. One of the chambers is in communication, through a penetrating hole opened in the enclosure, with a space on the side of the target, i.e., with the vacuum chamber which is evacuated for performing film forming processing therein. The other chamber is provided with a driving motor, and a driving shaft of the driving motor penetrates the partition wall to protrude into said one chamber. At a tip of this protruded driving shaft, there is provided a connection rod, and the connection rod is connected to a displacement plate. In this arrangement, when the driving motor is driven, the backing plate which is fixed to the displacement plate through a supporting plate and, consequently, the target makes a relative movement in relation to the magnet unit. According to this arrangement, when a rare gas or a reactive gas for electric discharging at the time of reactive sputtering is introduced into the vacuum chamber and, while the target is sputtered by applying predetermined electric power, e.g., with negative potential, the relative positions of the magnet unit do not change, even if the target is moved, and of a deposition-preventive plate (anode) to be provided in front of the target which looks inward of the vacuum chamber, do not change. Changes in the conditions of the plasma such as the position, density and the like of plasma on the surface of the target can thus be restrained.

In the above-mentioned prior art, however, since the enclosure of the film forming unit is directly mounted on the inner wall surface of the vacuum chamber, there are problems in that the mounting and dismounting of the film forming unit are troublesome, resulting in inconvenience in maintenance. Further, during sputtering, it is necessary to supply the backing plate with cooling medium such as cooling water. For that purpose, it is necessary to separately provide the wall surface of the vacuum chamber with water supply pipes and water distributing pipes separately, thereby resulting in complex apparatus arrangement.

PRIOR ART DOCUMENTS

Patent Documents

Patent Document 1: WO 2014/080815 A1

SUMMARY OF THE INVENTION

Problems that the Invention is to Solve

In view of the above points, this invention has a problem of providing a film forming unit for a sputtering apparatus which is free from the necessity of fabrication for installing supply pipes and discharge pipes of cooling medium relative to the vacuum chamber and which is simple in construction with convenience in maintenance, the above features being made available without impairing the function in which the target is relatively moveable in relation to the magnet unit.

Means for Solving the Problems

For solving the above-mentioned problems, a film forming unit for a sputtering apparatus according to this invention has the following features. In other words, in the film forming unit comprising a supporting plate detachably disposed on an opening in a vacuum chamber, provided that one-side surface of the supporting plate is defined as an upper side, the supporting plate has on the upper side thereof: a target with a backing plate bonded to a lower surface of the target; and a magnet unit fixedly disposed between the backing plate and the supporting plate so as to cause leakage magnetic field to function on the target. The film forming unit further comprises: driving means for reciprocating the target relative to the magnet unit along the supporting plate while electric power is applied from a sputtering power source to the target, thereby sputtering the target. In the above-mentioned film forming unit: the backing plate has disposed therein, in a protruding manner, a supply pipe and a discharge pipe for coolant, both being in communication with coolant passages formed inside the backing plate; the supporting plate has opened therein a slit hole which is elongated in the direction of reciprocating movement of the target and through which the supply pipe and the discharge pipe, both for coolant, are respectively inserted; the supporting plate has on its lower surface a cap body which hermetically encloses, inclusive of the slit hole, those portions of the supply pipe and the discharge pipe which are protruded downward from the slit hole; bellows pipes are respectively inserted onto an outside of those portions of the supply pipe and discharge pipe which are protruded in the reciprocating direction out of the cap body; and a drive part of the driving means is coupled to at least one of the supply pipe and the discharge pipe.

According to this invention, in a state in which the film forming unit is mounted on the opening in the vacuum chamber through the detachable supporting plate, by connecting pipes from the facility side to the supply pipe and the discharge pipe, the coolant can be circulated through the backing plate. Therefore, without impairing the function in that the target is relatively movable in relation to the magnet unit, the film forming unit can be made into such an arrangement as will have convenience of maintenance with a simple constitution. Further, at the time of evacuating the vacuum chamber, only the portion enclosed by the cap body need be evacuated. Therefore, there is no need of using a large-scale vacuum pump as the vacuum pump for evacuating the vacuum chamber. Still furthermore, since the driving means for driving the target is disposed in the atmosphere outside the vacuum chamber, there is no need of using the driving means for expensive vacuum purposes.

In this invention, in case a magnet unit is disposed between each of the targets and the supporting plate so as to cause the leakage magnetic field to function on the sputtered surface side of the target, provided that the direction in which the target reciprocates along the supporting plate is defined as an X-axis direction, that such a longitudinal direction of the target as is perpendicular to the X-axis direction is defined as the Y-axis direction, that the position at which the magnet unit and the target become concentric with each other is defined as an origin position, and that the position moved from the origin position in the Y-axis direction respectively in a predetermined stroke is defined as a turning position, preferably another driving means for relatively moving the magnet unit between the origin position and the turning position. According to this arrangement, it is possible to evade local erosion of the targets so that the targets can be eroded substantially uniformly over the entire surface to the life end of the targets. The use efficiency of the targets can thus be improved. In this case, in order for the film forming conditions not to change excessively, it is preferable: to appropriately move the magnet unit between the origin position and both the turning positions outside the film forming time during which film formation is performed by sputtering the targets and; during sputtering, to fix the targets to the position of the magnet unit after having moved, to thereby perform the film forming processing.

In this invention, in case two targets having a rectangular profile disposed side by side with each other on the same plane are provided, it is preferable: that the supply pipes and the discharge pipes are disposed respectively at both end parts of each of backing plates in a direction perpendicular to the reciprocating direction; and that one of the supply pipe and the discharge pipe of one target and one of the supply pipe and the discharge pipe of the other target, as well as the other of the supply pipe and the discharge pipe of said one target and the other of the supply pipe and the discharge pipe of the other target are respectively enclosed by a single cap body such that both the targets are reciprocated through a drive part in interlocking with each other. According to this arrangement, the inside volume of the cap body that is evacuated accompanied by the evacuation of the vacuum chamber can advantageously be minimized to the extent possible.

Further, according to this invention, by making an arrangement that an output cable from the sputtering power source is connected to at least one of the supply pipe and the discharge pipe so that electric power can be applied to the target through the backing plate, the constitution to charge electric power to the target can be simplified and, further, can be materialized as a film forming unit with convenience in maintenance work.

BRIEF DESCRIPTION OF THE DRAWINGS

FIG. 1 is a perspective view to explain a film forming unit according to a first embodiment of this invention.

MODES FOR CARRYING OUT THE INVENTION

With reference to the drawings, a description will now be made of a first embodiment of a film forming unit for a magnetron sputtering apparatus according to this invention. In the following, it is to be understood that the film forming unit is attached to, or detached from, an opening in a vacuum chamber (not illustrated) in a posture shown in FIG. 1 of a film forming unit $FU_1$, and the terms showing the direction such as "upper/top", "lower/bottom" and the like shall be based on the posture in question. Further, the direction in which the target moves back and forth (reciprocates) at a certain stroke relative to the magnet unit is defined as an X-axis direction, and the longitudinal direction of the target perpendicular to the X-axis direction is defined as a Y-axis direction.

Figure 2:
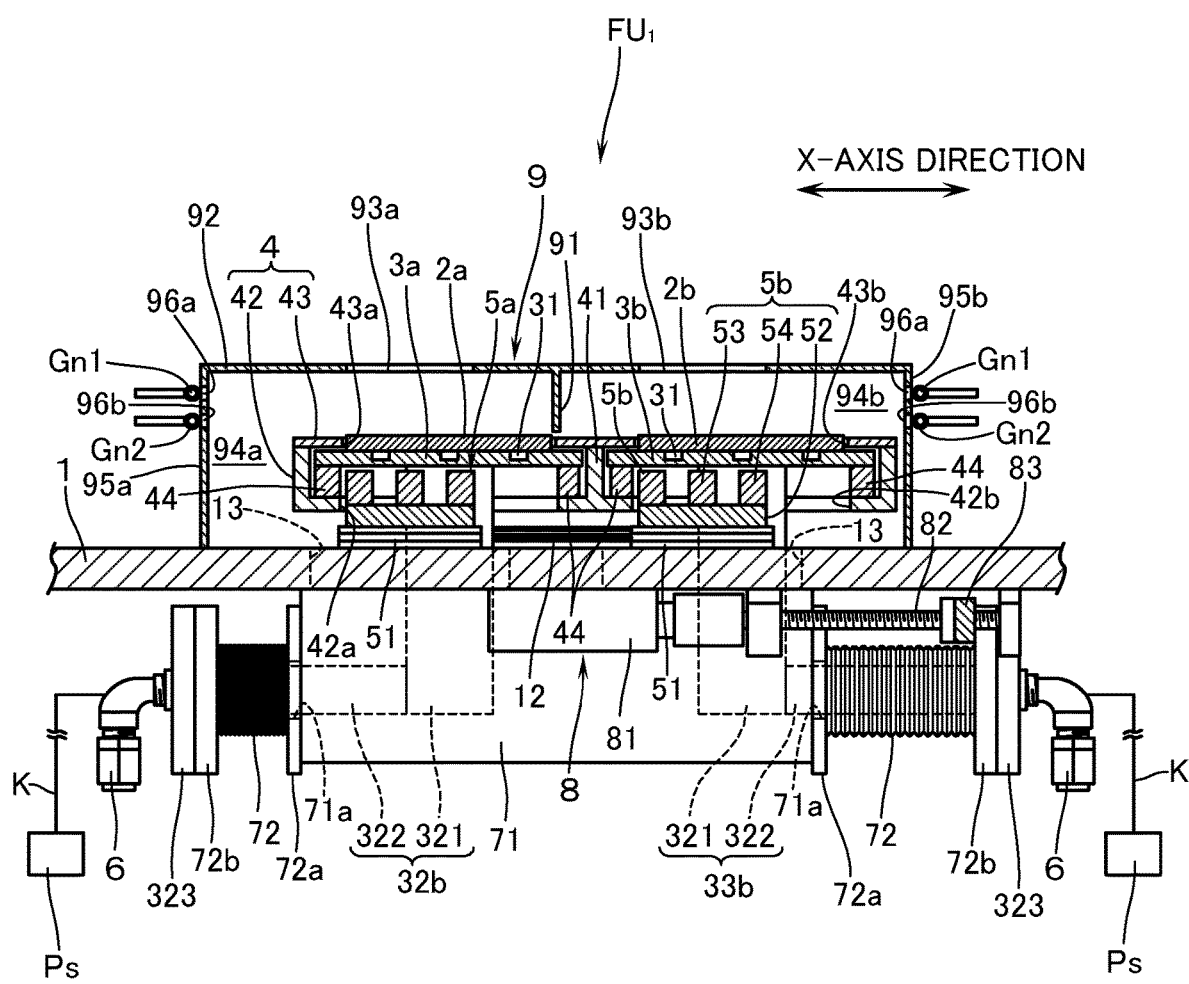
FIG. 2 is a sectional view along the line II-II in FIG. 1, in which the target is in an origin position.

With reference to FIGS. 1 to 4, reference mark $FU_1$ denotes a film forming unit for the magnetron sputtering apparatus according to the embodiment of this invention. The film forming unit is provided with a rectangular supporting plate 1 which is elongated in the X-axis direction and is capable of coming into close contact, through a vacuum seal 11, with a peripheral part of a lower opening of the vacuum chamber (not illustrated). On the supporting plate 1, there are disposed two targets 2a, 2b of the same configuration, elongated in the Y-axis direction with the same rectangular profile, in parallel with each other, at a distance in the X-axis direction from each other. The targets 2a, 2b are appropriately selected depending on the composition of the thin film to be formed on the substrate (not illustrated) disposed inside the vacuum chamber. To a lower surface of each of the targets 2a, 2b, there are bonded, as shown in FIG. 2, backing plates 3a, 3b, respectively, of the same configuration and having a larger rectangular profile than the targets 2a, 2b. The backing plates 3a, 3b have formed inside thereof coolant passages 31. Therefore, by supplying the coolant passages 31 with a coolant such as cooling water and the like, the targets 2a, 2b can be cooled during sputtering. In a state in which each of the targets 2a, 2b is bonded to the backing plate 3a, 3b, the targets are stored in a target case 4.

The target case 4 is made up of; a box body 42 which is divided into two chambers by a partition wall 41 elongated in the Y-axis direction, with the upper surface being left open; and a cover plate 43 which is mounted on the box body 42. On the inside of the bottom surface of the box body 42, there is disposed a spacer 44 made of an electrical insulating material. On top of the spacer 44 backing plates 3a, 3b are fixedly disposed. The cover plate 43 is so arranged that, when each of the targets 2a, 2b is stored into the box body 42 in a state of being bonded to the backing plates 3a, 3b, there are formed two first openings 43a, 43b in a manner to enclose the peripheries of the targets 2a, 2b while leaving a space in between.

Figure 3:
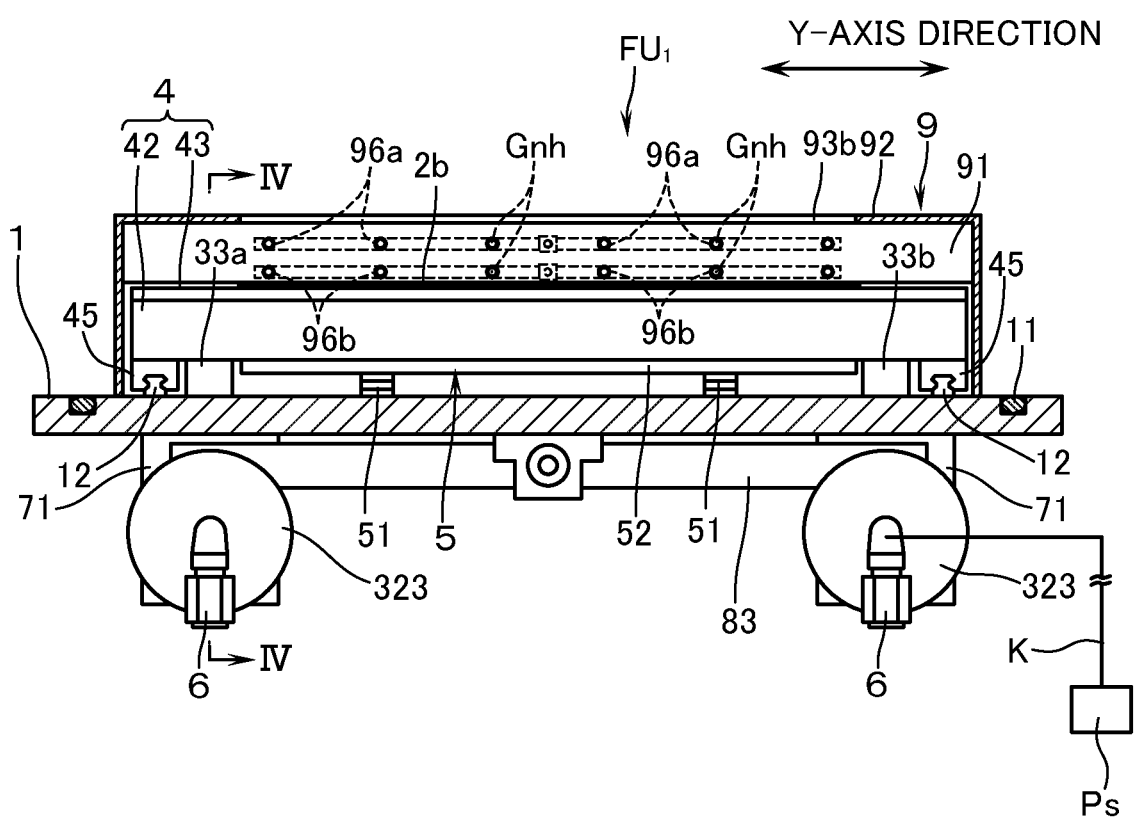
FIG. 3 is a sectional view along the line III-III in FIG. 1.

In the bottom surface of the box body 42 there are opened two second openings 42a, 42b which are elongated in the X-axis direction. In this case, the length in the X-axis direction of the second openings 42a, 42b is sized depending on the stroke in the reciprocating movements of the targets 2a, 2b. On the lower surfaces of the box bodies 42 which are located in both end parts in the Y-axis direction, as shown in FIG. 3, sliders 45 are respectively disposed. Each slider 45 is slidably engaged with a pair of rail members 12 disposed on the supporting plate 1 so as to be elongated in the X-axis direction. According to this arrangement, the target case 4 is supported on the supporting plate 1, and by means of driving means, to be described hereinafter, the target case 4 and consequently the targets 2a, 2b are reciprocated in the X-axis direction along a pair of rail members 12 in an interlocked manner at a certain stroke.

On the supporting plate 1, in a manner to be respectively positioned below the respective targets 2a, 2b, there are fixedly disposed magnet units 5a, 5b of the same configuration though a respective spacer 51 so as to be protruded into the box body 42 through the second openings 42a, 42b. Each of the magnet units 5a, 5b is provided with a yoke 52 which is elongated in the Y-axis direction with a rectangular profile. On an upper surface of the yoke 52 there are disposed a central magnet 53 and a peripheral magnet 54 which is disposed so as to enclose the central magnet 53. As the central magnet 53 and the peripheral magnet 54, there are used neodymium magnets of the same magnetization. For example, an integrally formed bar-shaped magnet having a substantially square cross-section may be used. According to this arrangement, a well-balanced closed loop leakage magnetic field can be functioned respectively on the targets 2a, 2b.

Figure 4:
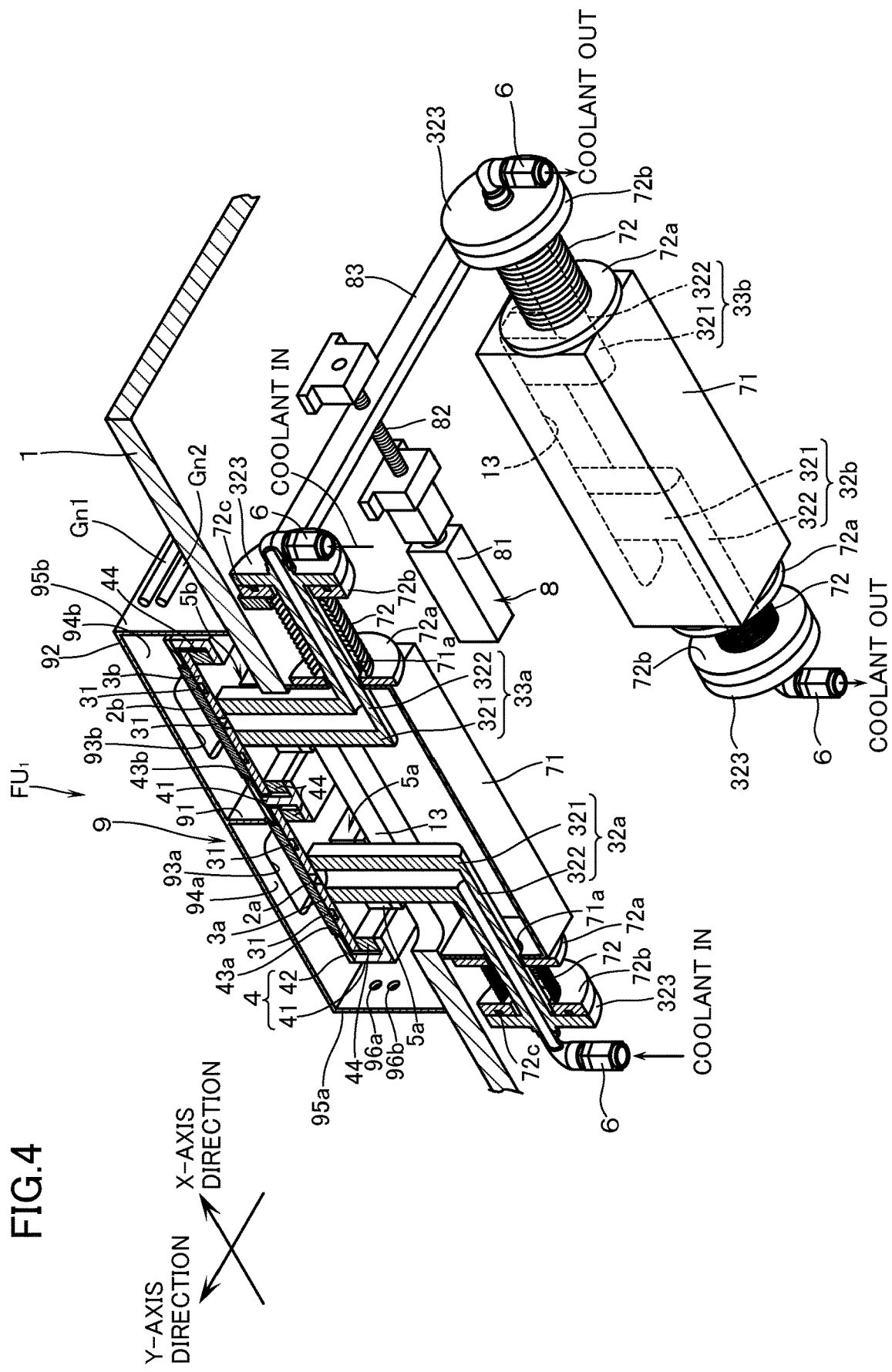
FIG. 4 is a sectional perspective view along the line IV-IV in FIG. 3.

Further, at both end parts in the Y-axis direction of each of the backing plates 3a, 3b, there are respectively disposed in a downwardly protruding manner coolant supply pipes 32a, 33a in communication with a coolant passage 31, as well as discharge pipes 32b, 33b. As shown in FIG. 4, the supply pipes 32a, 33a and the discharge pipes 32b, 33b are respectively formed of metal of the same configuration, and are respectively made up of; a first portion 321 which extends downward from the coolant passage 31; and a second portion 322 which extends in the X-axis direction from the lower end of the first portion 321. In this case, the second portion 322 of the supply pipe 32a of one backing plate 3a and the second portion 322 of the supply pipe 33a of the other backing plate 3b, as well as the second portion 322 of the discharge pipe 32b of said one backing plate 3a and the second portion 322 of the discharge pipe 33b of the other backing plate 3b are arranged to extend from the first portion 321 on the same line in the X-axis direction toward the opposite direction respectively. Further, a mounting flange 323 is respectively formed at an end part of the second portion 322, and a coupling 6 is disposed in a protruding manner on the outer surface of the mounting flange 323 so that a pipe from a facility side (not illustrated) can be connected. It is arranged that: the coupling 6 has connected thereto an output cable K from a sputtering power source Ps which is appropriately selected out of a DC power source, high-frequency power source, and the like depending on the kind of the target 2a, 2b (see FIG. 2); and that DC power and high-frequency power having negative potential can be applied from the supply pipes 32a, 33a or the discharge pipes 32b, 33b to the targets 2a, 2b through the backing plates 3a, 3b. In this embodiment, the coupling 6 is a constituting part of the supply pipes 32a, 33a and the discharge pipes 32b, 33b.

In addition, the supporting plate 1 has formed therein, in a manner to be elongated in the X-axis direction, two slit holes 13 through which each of the supply pipes 32a, 33a and each of the discharge pipes 32b, 33b respectively penetrate. It is thus so arranged that, in a state in which the target case 4 is placed on the supporting plate 1, the first portion 321 of each of the supply pipes 32a, 33a and each of the discharge pipes 32b, 33b, which extend from the backing plates 3a, 3b, penetrate the slit hole 13 to protrude downward. The length, in the X-axis direction, of the slit hole 13 is sized depending on the reciprocating stroke of the targets 2a, 2b. On the lower surface of the supporting plate 1, there are disposed two cap bodies 71 which enclose to hermetically maintain the inside, inclusive of the slit hole 13, of those first portions 321 of the supply pipes 32a, 33a and the discharge pipes 32b, 33b which penetrate through the slit hole 13 and protrude downward. Each of the cap bodies 71 is arranged to respectively enclose the supply pipe 32a of said one backing plate 3a and the supply pipe 33a of the other backing plate 3b, as well as the discharge pipe 32b of said one backing plate 3a and the discharge pipe 33b of the other backing plate 3b. Further, each of the cap bodies 71 has opened a through hole 71a respectively being penetrated by the second portion 322. Between the cap body 71 and each of the mounting flanges 323, there are externally inserted (i.e., inserted onto an outside of) a respective bellows pipe 72 of the same configuration for hermetically holding the second portion 322 which protrudes beyond the cap body 71. In this case, the penetrating hole 71a of the cap body 71 is respectively hermetically sealed by sealing means (not illustrated) disposed on one flange 72a of the bellows pipe 72, and the flange on the other side of the bellows pipe 72 is coupled to the inside surface of the mounting flange 323 through the sealing means 72c.

Figure 5:
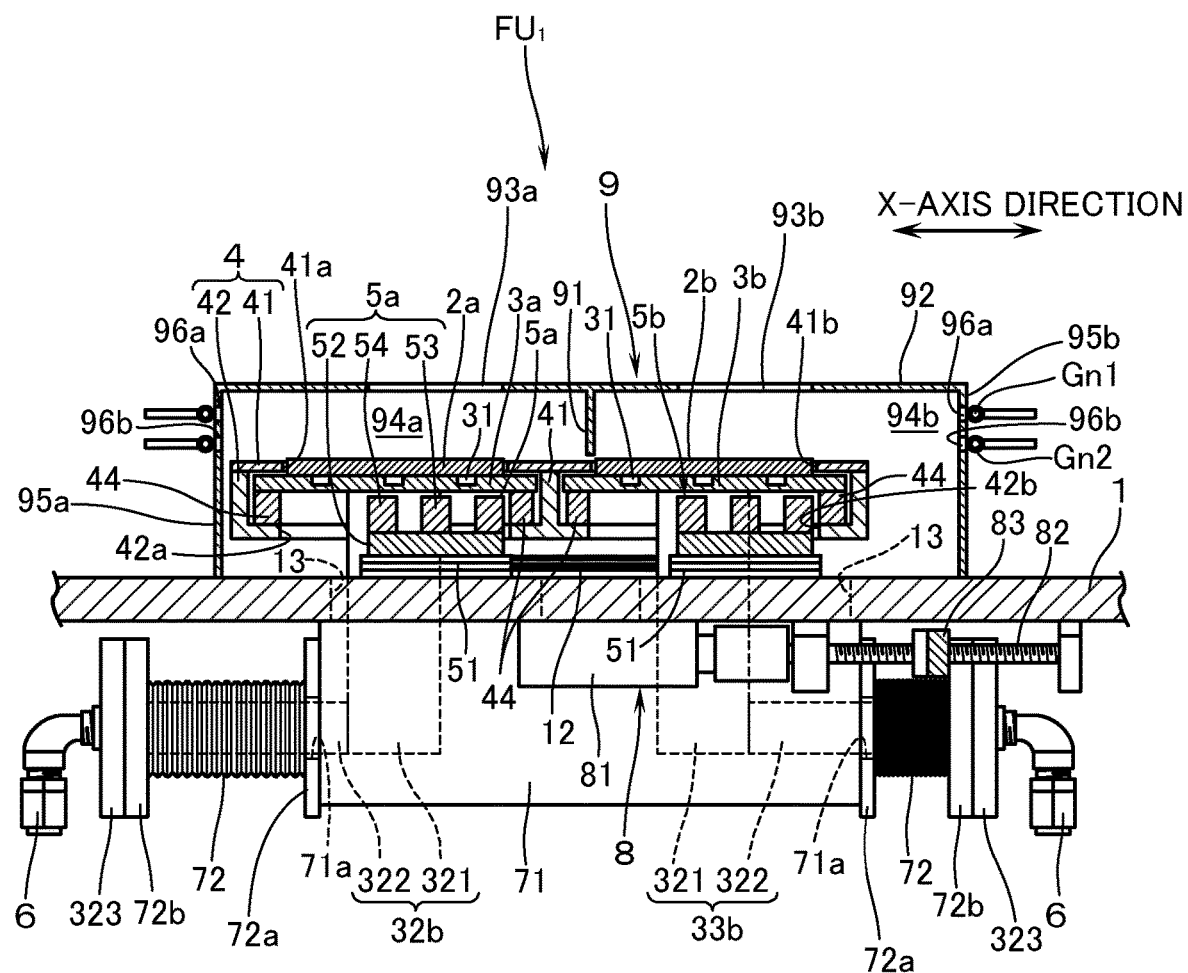
FIG. 5 is a sectional view corresponding to FIG. 2, showing the state in which the target has been moved to a turning position.

Driving means 8 is disposed on the lower surface of the supporting plate 1. The driving means 8 is provided, as shown in FIG. 4, with: a motor 81 which is mounted on the center of the lower surface of the supporting plate 1; feed screw 82 which is connected, as a drive part, to the motor 81; and an operation rod 83, as a drive part, which is coupled to the feed screw 82 in a threaded manner. Both end parts of the operation rod 83 are coupled to the supply pipe 33a and the mounting flange 323 of the other backing plate 3b, respectively. According to this arrangement, provided that one side in the X-axis direction (i.e., the position toward the right side relative to the magnet units 5a, 5b, as shown in FIG. 2) is defined as an origin position in the reciprocating movement, if the feed screw 82 is rotated by the motor 81 in one direction, the supply pipe 33a and the discharge pipe 33b of the other backing plate 3b are moved, in interlocking with each other by the operation rod 83, and the targets 2a, 2b are moved toward the opposite side in the X-axis direction (left side as seen in FIG. 2). As a result, the magnet case 4 moves and the targets 2a, 2b reach the turning position on the other side in the X-axis direction (i.e., the position toward the left side relative to the magnet units 5a, 5b, as shown in FIG. 5). At this time, the magnet case 4 moves in a state of isolated from the atmosphere by the telescopic bellows pipes 72, in other words, when the film is formed by sputtering in vacuum by mounting the supporting plate 1 on the vacuum chamber, the magnet case 4 moves in a state in which the vacuum atmosphere in the vacuum chamber is maintained. When the targets 2a, 2b have reached the turning position on the other side in the X-axis direction, the feed screw 82 will be reversed in rotation by the motor 81 and, by means of the operation rod 83, the feed pipe 33a and the discharge pipe 33b are moved, in interlocking with each other, toward said one side in the X-axis direction. Accompanied by this movement, the magnet case 4 is moved and the targets 2a, 2b will be returned to the origin position. By repeating this movement, the targets 2a, 2b are reciprocated. By the way, the driving means 8 is not limited to the above-mentioned arrangement but, as long as the targets 2a, 2b can be moved in synchronization with each other, any configuration will do.

Further, on the supporting plate 1, there is disposed a cover body 9 which encloses the targets 2a, 2b with a space on an upper side thereof. The cover body 9 is of a box shape with the lower surface being left open and is disposed on the supporting plate 1 with the lower end thereof being kept in close contact with the supporting plate 1 over the entire circumference thereof. Inside the cover body 9 there is disposed a partition plate 91 such that the space 94a in which one target 2a is present and the space 94b in which the other target 2b is present are isolated from each other. An upper wall part 92 of the cover body 9 has formed therein two openings 93a, 93b in a manner to face each of the targets 2a, 2b respectively. According to this arrangement, once the film forming unit $FU_1$ is mounted on the vacuum chamber, and the vacuum pump which is connected to the vacuum chamber is operated to thereby evacuate the space 94a, 94b (i.e., in which the reciprocating targets are present and in which plasma is formed) enclosed by the supporting plate 1 and the cover body 9 mainly through the openings 93a, 93b.

The outside surfaces of the side wall parts 95a, 95b which are present in the X-axis direction of the cover body 9 are respectively provided with two gas nozzles Gn1, Gn2. Each of the gas nozzles Gn1, Gn2 has a length enough to lie along the Y-axis direction of the targets 2a, 2b. Ejection ports Gnh to eject the gas toward the side wall parts of the cover body 9 are arranged in rows. In this case, the gas nozzles Gn1 which are positioned on the upper side are for introducing rare gas for electric discharging, and the gas nozzles Gn2 which are positioned on the lower side are for introducing reactive gas. The side wall parts 95a, 95b of the cover body 9 have formed therethrough, by means of piercing, gas holes 96a, 96b in a manner to lie opposite to each of the ejection ports Gnh. In this case, the diameter of each of the gas holes 96a, 96b is set equal to or above the diameter of the ejection ports Gnh. According to this arrangement, when the rare gas for electric discharging or the reactive gas is ejected from the ejection ports Gnh of each of the gas nozzles Gn1, Gn2, the ejected rare gas for electric discharging or the reactive gas is introduced mainly through each of the gas holes 96a, 96b into each of the space 94a, 94b in the cover body 9. By the way, the positions of mounting each of the gas nozzles Gn1, Gn2 on the side wall part of the cover body 9, the diameter and the number of ejection ports Gnh are appropriately selected considering the volume of the vacuum chamber, the exhausting capacity of the vacuum pump, and the like. In addition, a description will be made of an example in which the gas holes 96a, 96b are made through the side wall parts 96a, 96b of the cover body 9, but without being limited to the above, this invention may constitute the gas holes by slit-shaped elongated holes which face each of a plurality of ejection ports Gnh.

Even if the targets 2a, 2b are reciprocated according to the above-mentioned arrangement, the exhausting conductance from the inside space 94a, 94b of the cover body 9 makes little or no change. Further, at the time of film formation by the reactive sputtering, even if the reactive gas is introduced by the gas nozzle Gn2 through the gas hole 96 into the vacuum chamber, the distribution of the reactive gas in the space 94a, 94b makes little or no change. As a result, thin films can be formed by reactive sputtering with good uniformity in the film quality. It is to be noted here that the cover body 9 contacts the supporting plate 1, and that the supporting plate 1 is normally mounted on the vacuum chamber which is grounded. Therefore, the cover body 9 itself will be of ground potential and, when the targets 2a, 2b are sputtered through electric charging, the upper wall part 92 of the cover body 9 which is positioned in the periphery of each opening 93a, 93b will serve the purpose of an anode, whereby electric discharging can stably be made.

According to the above embodiment, in a state in which the film forming unit $FU_1$ is mounted on the opening of the vacuum chamber through the detachable supporting plate 1, piping (not illustrated) from the facility to each of the couplings 6 between the supply pipes 32a, 33a and the discharge pipes 32b, 33b may be connected. Then, the coolant can be circulated through the backing plates 3a, 3b. Therefore, the film forming unit $FU_1$ can be made into a simplified construction with convenience in maintenance. Further, the volume inside the cap body 71 to be evacuated as a consequence of evacuation of the vacuum chamber can be minimized to the extent possible. Still furthermore, at the time of evacuating the vacuum chamber, only the portion enclosed by the cap body 71 need be evacuated. Therefore, there is no need of using a large-scale vacuum pump for evacuating the vacuum chamber. In addition, since the driving means 8 for driving the targets 2a, 2b is disposed in the atmosphere outside the vacuum chamber, it is not necessary to use an expensive driving means 8 for use in the vacuum system.

Especially, the above-mentioned embodiment has employed an arrangement in that: the second portion 322 of the supply pipe 32a of said one backing plate 3a and the second portion 322 of the supply pipe 33a of the other backing plate 3b, as well as the second portion 322 of the discharge pipe 32b of said one backing plate 3a and the second portion 322 of the discharge pipe 33b of the other backing plate 3b are positioned on the same line; that the same configuration of bellows pipes 72 are coupled to the outside of each of the second portions 322. Therefore, when the targets 2a, 2b reciprocate by the driving means 8, the differential pressure between the atmospheric pressure and the vacuum pressure can be cancelled. Since the driving means 8 need not be responsible for taking care of the differential pressure, the motor 81 for the driving means 8 may be of small rated torque. In addition, since the force to resist the vacuum pressure is not required, the operation rod 83 need not have a great strength, and the feed screw 82 may also be of a finer one. As a consequence, a further reduction in cost is possible. Still furthermore, should the driving means 8, e.g., the motor 81, be out of order for some reason or other, the consequence will only be that the bellows pipes 72 will return to the position in which the spring forces of each of the bellows pipes 72 are well balance. Therefore, high safety can be obtained without the necessity for structural or electrical means for preventing damages to the drive part such as the feed screw, operation rod 83, and the like.

By the way, in the case of a driving system in which parts in vacuum (targets 2a, 2b in the above-mentioned embodiment) are reciprocated by a motor which is disposed in the atmosphere, there are two kinds of operations in the motor, one being regeneration operation in the pressure receiving direction in which vacuum pressure operates on the parts in question, and the other being power operation in the counter-pressure-receiving direction against the vacuum pressure. From the viewpoint of energy, the power operation can be said to correspond to the input of the energy, and the regeneration operation can be said to correspond to the recovery of the energy. In this kind of conventional driving system, it is normal practice to design, at the time of regeneration operation, so as to release out of the system as heat by resistors disposed, e.g., in driving circuit of the motor. This arrangement means, however, that the electric power corresponding to the vacuum pressure will all be converted to heat, resulting in an enormous load on the electric power energy. On the other hand, in the above-mentioned embodiment, at the time of regeneration operation, it is only the electric power to resist the friction force that is consumed, whereby the load on the electric power energy may be small. In addition, since inexpensive and general-purpose driving system can be used, the cost for the equipment can also be restrained.

So far a description has been made of an embodiment of this invention, but this invention shall not be limited to the above. In the above-mentioned embodiment, a description was made of an example of using two targets $2a$, $2b$. This invention can also be applicable to a case in which a single target is used. In addition, also in case three targets are used, the film forming unit $FU_1$ can be made into one with convenience in maintenance in a simple construction. Further in the above-mentioned embodiment, a description was made of an example in which the targets $2a$, $2b$ are stored in the magnet case 4, but this invention shall not be limited to the above. As long as the targets are arranged to be in a state of being electrically insulated from the supporting plate and are also capable of reciprocation relative to the magnet units, its configuration is not questioned. Further, in the above-mentioned embodiment, a description was made of an example in which the film forming unit $FU_1$ is equipped with a cover body 9, but the cover body itself may be omitted. Furthermore, the driving system in the above-mentioned embodiment in which the targets $2a$, $2b$ as parts in vacuum are reciprocated by the motor 81 disposed in the atmosphere, may be diverted to the driving systems for parts such as gate valves and the like to be disposed in the vacuum.

By the way, in case the magnet units $5a$, $5b$ are respectively made up of the central magnet 53 disposed on the upper surface of the yoke 52, and the peripheral magnet 54 which encloses the central magnet 53 as in the above-mentioned embodiment, when the rare gas and the like for electric discharging is introduced, and electric power is applied to the targets $2a$, $2b$, plasma will be generated along racetracks. However, at the corner parts of the racetracks, the electron density in the plasma is likely to be locally higher. In such a case, if the magnet units $5a$, $5b$ are fixedly disposed on the supporting plate 1 so as to be positioned respectively below each of the targets $2a$, $2b$, as a result of relative movement, in the X-axis direction, of the targets $2a$, $2b$ in relation to the magnet units $5a$, $5b$, the target $2a$, $2b$ will be eroded substantially uniformly in the X-axis direction, but in the end parts in the Y-axis direction of the targets $2a$, $2b$ corresponding to the corner parts of the racetracks, the targets $2a$, $2b$ will be locally eroded. As a result, the targets $2a$, $2b$ will prematurely reach the life end, resulting in poor utilization efficiency of the targets $2a$, $2b$.

As a solution, it is preferable to constitute such that: a driving shaft, penetrating the slit hole formed in the supporting plate 1 in a manner to be elongated in the Y-axis direction, is connected to the rear surface of the yoke 52 and that; by means of a driving source disposed in the atmosphere, the magnet units $5a$, $5b$ are made to be relatively movable via the driving shaft in the Y-axis direction in relation to the targets $2a$, $2b$. In this case, provided that the position in which the magnet units $5a$, $5b$ and the targets $2a$, $2b$ become concentric with each other is defined as an origin position and that the position of having moved from this origin position in the Y-axis direction by respective predetermined strokes is defined as a turning position, the magnet units $5a$, $5b$ are relatively moved between the origin position and the turning position. According to this arrangement, it is possible to prevent the targets $2a$, $2b$ from getting locally eroded so that the targets $2a$, $2b$ can be substantially uniformly eroded to the life end of the targets $2a$, $2b$ over the entire surface thereof. As a result, the utilization efficiency of the targets $2a$, $2b$ can be improved.

As the driving source, the driving source may make use of the driving system according to the above-mentioned embodiment in which the targets $2a$, $2b$ as the parts in vacuum are reciprocated by the motor 81 to be disposed in the atmosphere. The relative movement of the targets $2a$, $2b$ in relation to the magnet units $5a$, $5b$ shall preferably be not performed during sputtering of the targets $2a$, $2b$ so that the film forming conditions do not excessively change. For example, depending on the integrated amount of applied electric power, e.g., to the targets $2a$, $2b$, the magnet units $5a$, $5b$ shall preferably be moved appropriately between the origin position and the turning position. In this case, the stroke of the relative movement of the magnet units $5a$, $5b$ in relation to the targets $2a$, $2b$, and the duration of stay at the origin position or the turning position can appropriately be set by measuring the eroded region and the erosion speed at the time of sputtering the targets $2a$, $2b$ at, e.g., the origin position. By the way, the position of movement of the magnet units $5a$, $5b$ is not limited to the above case of three points, but may be appropriately increased depending on the state of erosion of the targets $2a$, $2b$. By the way, if the film forming conditions, for example, do not vary excessively, during the sputtering of the targets $2a$, $2b$, the magnet units $5a$, $5b$ may be appropriately reciprocated at a predetermined speed between both the turning positions.

Next, with reference to FIGS. 6 to 8, a description will be made of a film forming unit $FU_2$, according to a second embodiment, for a sputtering apparatus in which the targets $2a$, $2b$ are capable of reciprocation in the X-axis direction by the first driving means $80a$ and in which the magnet units $5a$, $5b$ are capable of reciprocation in the Y-axis direction by the second driving means $80b$. In the following, in the same manner as in the above-mentioned first embodiment, provided that the direction in which the targets $2a$, $2b$ are reciprocated relative to the magnet units $5a$, $5b$ at a certain stroke is defined as the X-axis direction, and that the direction perpendicular to the X-axis direction is defined as the Y-axis direction, and that the same members or elements as the above-mentioned first embodiment are assigned the same reference marks, the constitution which is different from the above-mentioned first embodiment will be explained.

Figure 6:
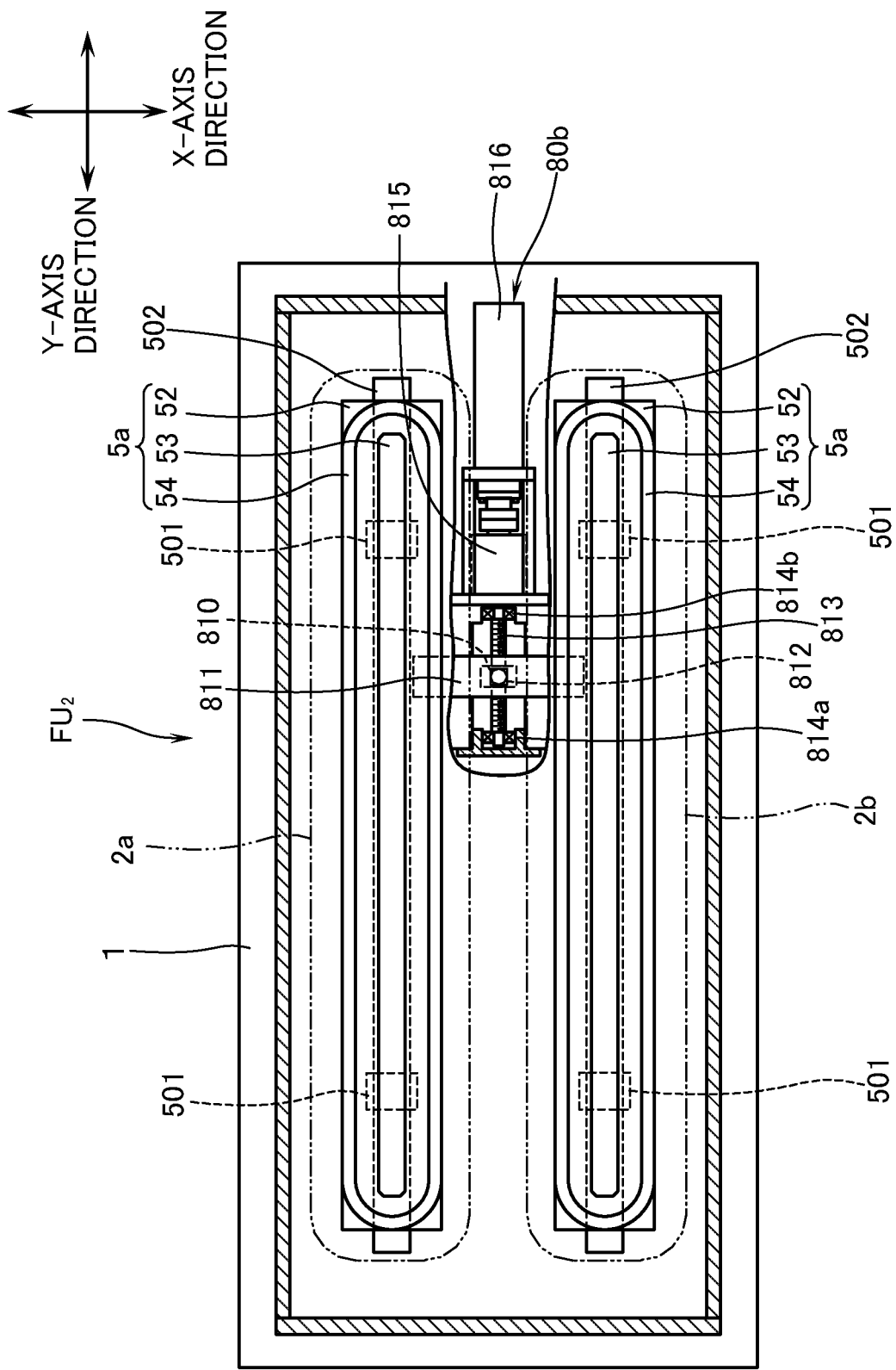
FIG. 6 is a plan view to explain the film forming unit according to a second embodiment of this invention.
Figure 7:
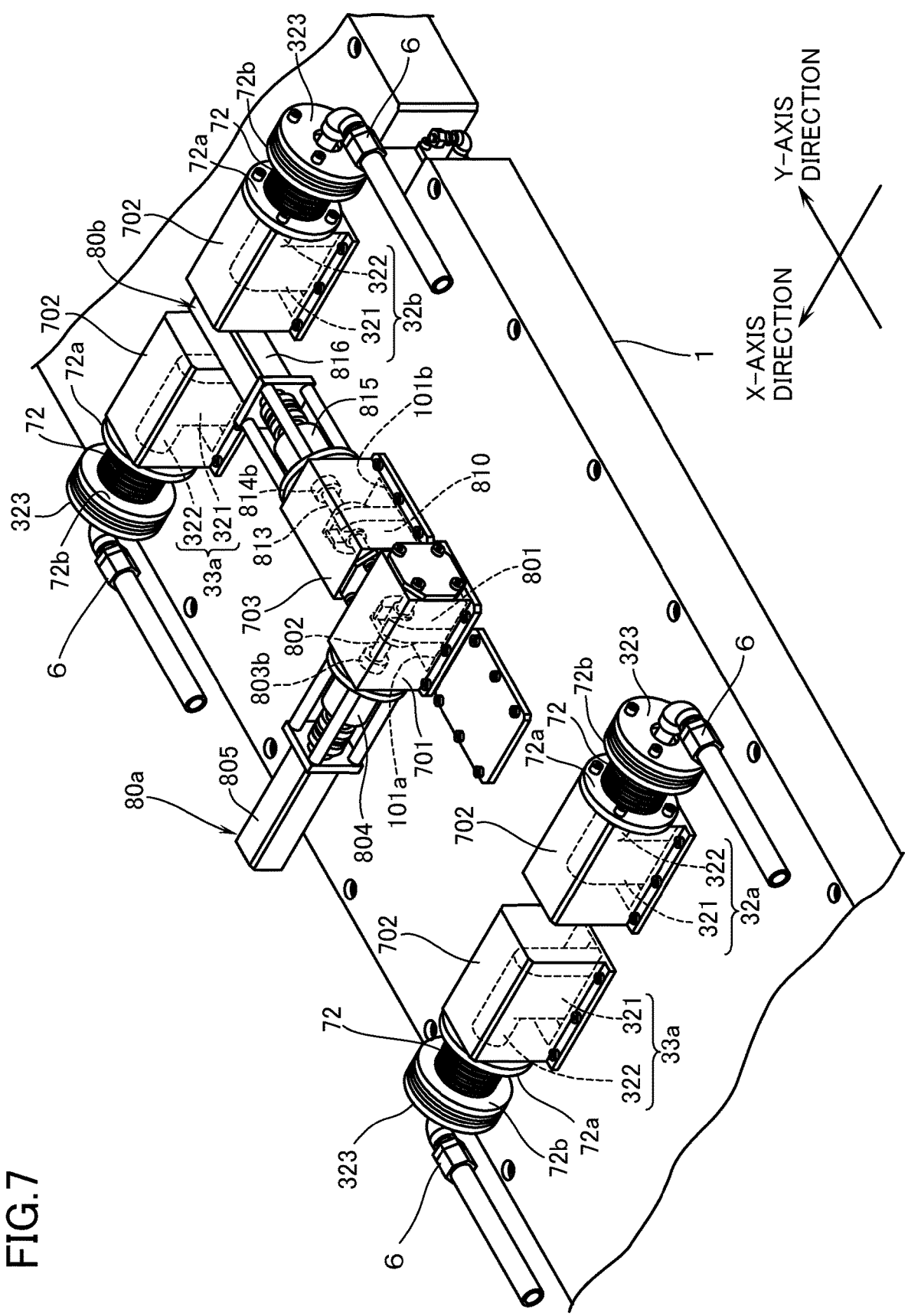
FIG. 7 is a perspective view of the film forming unit of the second embodiment, taken from the rear side.
Figure 8:
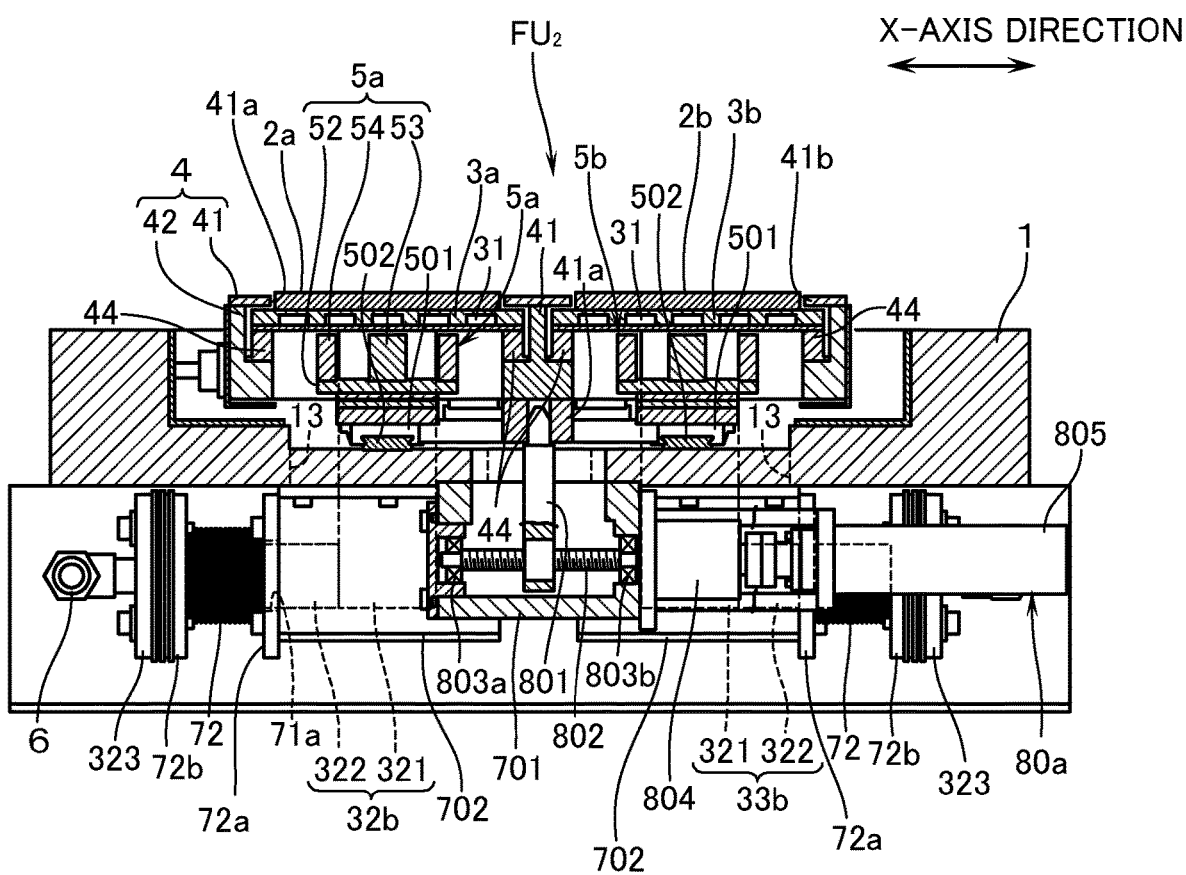
FIG. 8 is a sectional view, corresponding to FIG. 2, of the film forming unit according to a second embodiment.

As shown in FIGS. 6 to 8, the film forming unit $FU_2$ for the magnetron sputtering apparatus is provided, as in the first embodiment, with the supporting plate 1, and two targets $2a$, $2b$ that are of the same configuration and have a rectangular outline elongated in the Y-axis direction are disposed on the supporting plate 1 side by side with each other in a state of being bonded to the backing plates $3a$, $3b$, and is stored in the target case 4. The sliders 45 which are respectively disposed on the lower surface of the box bodies 42 positioned on axially both end parts of the box bodies 42, are slidably engaged with a pair of rail members 12 which are disposed on the supporting plate 1 so as to be elongated in the X-axis direction. By the first driving means $80a$ the target cases 4, and consequently the targets $2a$, $2b$ are reciprocated, along a pair of rail members (not illustrated) in the X-axis direction in a certain stroke in a manner interlocked with the targets 2a, 2b.

The first driving means 80a which reciprocate the targets 2a, 2b in the X-axis direction is provided with a plate-like driving shaft 801 to be inserted into a first slit hole 101a which is opened in the central part of the support body 1 so as to be elongated in the X-axis direction. In this case, the length, in the X-axis direction, of the slit hole 101a is sized depending on the stroke of the reciprocating movement of the targets 2a, 2b in the same manner as in the first embodiment. The upper end of the driving shaft 801 is fitted to a cylindrical body 41a which is vertically disposed in a predetermined position on the lower surface of the partition wall 41 of the magnet case 4. The lower end of the driving shaft 801 which is protruded from the supporting body 1 downward has formed therein a threaded hole (not illustrated) in the plate thickness direction. The threaded hole has screwed therein a feed screw 802 which extends in the X-axis direction. In this case, the feed screw 802 is disposed below the lower surface of the supporting plate 1 and is held in a rotatable manner, through a pair of bearings 803a, 803b, by a cap body 701 which encloses, inclusive of the slit hole 101a, the lower end of the driving shaft 801 protruding downward from the supporting body 1, thereby maintaining the inside thereof hermetically sealed. To one end of the feed screw 802 which protrudes from the cap body 701 outward, there is connected a motor 805 which is attached to the lower surface of the supporting plate 1 through a magnetic fluid seal 804. According to this arrangement, the magnet case 4, and consequently the targets 2a, 2b are made to be capable of reciprocating in the X-axis direction. According to this arrangement, unlike the above-mentioned first embodiment, since the driving shaft 801 is directly coupled to the magnet case 4, the parts like the operation rod 83 in the first embodiment can be omitted. The driving input route can therefore be simplified and, in addition, improvement in the rigidity can be attempted. Especially, in case the targets 2a, 2b are long in the Y-axis direction and, accompanied by this, the operation rod 83 will have to be elongated, the above-mentioned second embodiment in which driving is performed by magnet case 4 in the central portion (in the neighborhood of the center of rotational inertia) of the magnet case 4, may be applied more effectively. By the way, in the second embodiment, accompanied by the changes to the arrangement of the driving means 80a, the cap body 702 which is disposed on the lower surface of the supporting plate 1 has been modified in a manner that such a first portion 321 between the supply pipes 32a, 33a and the discharge pipes 32b, 33b as will protrude downward through the slit hole 13, are respectively enclosed (see FIG. 7).

Further, the second driving means 80b for reciprocating the magnet units 5a, 5b in the Y-axis direction is provided with a plate-shaped driving shaft 810 which is to be inserted into the second slit hole 101b, elongated in the Y-axis direction and opened in the supporting body 1 so as to be positioned near the first slit hole 101a. The length in the Y-axis direction of the slit hole 101b is sized depending on the stroke in the reciprocating movement of the magnet units 5a, 5b. The upper end of the driving shaft 810 is fitted into a fitting hole 812 which is formed in the driving plate 811 disposed in a manner to bridge the yokes 52 of each of the magnet units 5a, 5b. In this case, on the lower surface of each yoke 52 of the magnet units 5a, 5b, as shown in FIG. 8, there is respectively disposed a slider 501. Each of the sliders 501 is respectively engaged slidably with the rail members 502 which are elongated in the Y-axis direction and are disposed on the supporting plate 1.

On the other hand, in the lower end of the driving shaft 810 which is protruded downward from the supporting body 1, a threaded hole in the direction of the plate thickness (not illustrated) is formed, and feed screw 813 extending in the Y-axis direction is engaged with the threaded hole in a screwed manner. In this case, the feed screw 813 is rotatably supported on a cap body 703 through a pair of bearings 814a, 814b, the cap body being provided on the lower surface of the supporting plate 1 so as to enclose the lower end of the driving shaft 810 which protrudes from the supporting body 1 downward, inclusive of the slit hole 101b, thereby keeping the inside thereof hermetically sealed. On one end of the feed screw 813 which protrudes from the cap body 703, there is connected another motor 816 which is mounted on the lower surface of the supporting body 1 through magnetic fluid seal 815. According to this arrangement, the magnet units 5a, 5b are capable of reciprocating in the Y-axis direction.

EXPLANATION OF MARKS $FU_1$, $FU_2$ film forming unit for a sputtering apparatus
1 supporting plate
13 slit hole
2a, 2b target
3a, 3b backing plate
31 coolant passage
32a, 33a feed pipe
33a, 33b discharge pipe
5a, 5b magnet unit
71 cap body
72 bellows pipe
8, 80a, 80b driving means
82 feed screw (drive part)
83 operation rod (drive part)
9 cover body
92 opening
Ps sputtering power source
K output cable

The invention claimed is:

1. A film forming unit for a sputtering apparatus comprising:
   a supporting plate detachably disposed on an opening in a vacuum chamber, provided that one-side surface of the supporting plate is defined as an upper side, the supporting plate having on the upper side thereof;
   at least one target, each target having a backing plate bonded to a lower surface of the target;
   a magnet unit fixedly disposed between the backing plate and the supporting plate so as to cause leakage magnetic field to function on the target; and
   driving means for reciprocating the target relative to the magnet unit along the supporting plate while electric power is applied from a sputtering power source to the target, thereby sputtering the target,
   wherein:
   each backing plate has a supply pipe and a discharge pipe for coolant,
   the supply pipe and discharge pipe protrude into the backing plate for communication with coolant passages formed inside the backing plate;
   the supporting plate has a slit hole which is elongated in the direction of reciprocating movement of the target and through which the supply pipe and the discharge pipe, both for coolant, are respectively inserted;
   the supporting plate has on its lower surface a cap body which hermetically encloses, inclusive of the slit hole, those portions of the supply pipe and the discharge pipe which are protruded downward from the slit hole;

bellows pipes are respectively inserted onto an outside of those portions of the supply pipe and discharge pipe which are protruded in the reciprocating direction out of the cap body; and a drive part of the driving means is coupled to at least one of the supply pipe and the discharge pipe.

2. The film forming unit for a sputtering apparatus according to claim 1, further comprising:

a magnet unit disposed between each target and the supporting plate so as to cause the leakage magnetic field to function on the sputtered surface side of the target; and provided that the direction in which the target reciprocates along the supporting plate is defined as an X-axis direction, that such a longitudinal direction of the target as is perpendicular to the X-axis direction is defined as the Y-axis direction, that the position at which the magnet unit and the target become concentric with each other is defined as an origin position, and that the position moved from the origin position in the Y-axis direction respectively in a predetermined stroke is defined as a turning position, another driving means for relatively moving the magnet unit between the origin position and the turning position.

3. The film forming unit for a sputtering apparatus according to claim 1, wherein each target having a rectangular profile and disposed side by side with each other on the same plane, wherein the supply pipes and the discharge pipes are disposed respectively at both end parts of the backing plate in a direction perpendicular to the reciprocating direction, wherein one of the supply pipe and the discharge pipe of one target and one of the supply pipe and the discharge pipe of the other target, as well as the other of the supply pipe and the discharge pipe of said one target and the other of the supply pipe and the discharge pipe of the other target are respectively enclosed by a single cap body such that both the targets are reciprocated through a drive part interlocking with each other.

4. The film forming unit for a sputtering apparatus according to claim 1, wherein an output cable from the sputtering power source is connected to at least one of the supply pipe and the discharge pipe so that electric power can be applied to the target through the backing plate.

* * * * *